United States Patent
Schweitzer, Jr.

[11] Patent Number: 5,821,869
[45] Date of Patent: Oct. 13, 1998

[54] FAULT INDICATOR FOR USE WITH LOAD-BREAK CONNECTOR

[76] Inventor: Edmund O. Schweitzer, Jr., 2433 Center St., Northbrook, Ill. 60062

[21] Appl. No.: 796,536

[22] Filed: Feb. 6, 1997

[51] Int. Cl.$^6$ ................................................. G08B 21/00
[52] U.S. Cl. ...................... 340/660; 340/664; 340/691; 340/693; 340/815.71; 324/133; 116/284; 116/204; 116/298
[58] Field of Search .................... 340/660, 664, 340/691, 693, 815.71; 116/278, 284, 289, 286, 204, 298; 324/133

[56] References Cited

U.S. PATENT DOCUMENTS

| | | | |
|---|---|---|---|
| 3,906,477 | 9/1975 | Schweitzer, Jr. | 340/660 |
| 3,991,366 | 11/1976 | Schweitzer, Jr. | 324/133 |
| 4,034,360 | 7/1977 | Schweitzer, Jr. | 340/253 |
| 4,063,171 | 12/1977 | Schweitzer, Jr. | 324/133 |
| 4,086,529 | 4/1978 | Schweitzer, Jr. | 324/127 |
| 4,152,643 | 5/1979 | Schweitzer, Jr. | 324/120 |
| 4,165,528 | 8/1979 | Schweitzer, Jr. | 361/156 |
| 4,234,847 | 11/1980 | Schweitzer, Jr. | 324/146 |
| 4,251,770 | 2/1981 | Schweitzer, Jr. | 324/133 |
| 4,263,550 | 4/1981 | Schweitzer, Jr. | 324/133 |
| 4,288,743 | 9/1981 | Schweitzer, Jr. | 324/127 |
| 4,375,617 | 3/1983 | Schweitzer, Jr. | 324/133 |
| 4,414,543 | 11/1983 | Schweitzer, Jr. | 340/651 |
| 4,424,512 | 1/1984 | Schweitzer, Jr. | 340/664 |
| 4,438,403 | 3/1984 | Schweitzer, Jr. | 324/133 |
| 4,456,873 | 6/1984 | Schweitzer, Jr. | 324/51 |
| 4,458,198 | 7/1984 | Schweitzer, Jr. | 324/133 |
| 4,495,489 | 1/1985 | Schweitzer, Jr. | 340/664 |
| 4,536,758 | 8/1985 | Schweitzer, Jr. | 340/664 |
| 4,550,288 | 10/1985 | Schweitzer, Jr. | 324/133 |
| 4,641,220 | 2/1987 | Schweitzer, Jr. | 361/187 |
| 4,646,006 | 2/1987 | Schweitzer, Jr. | 324/127 |
| 4,686,518 | 8/1987 | Schweitzer, Jr. | |
| 4,706,016 | 11/1987 | Schweitzer, Jr. | 324/102 |
| 4,714,916 | 12/1987 | Schweitzer, Jr. | 340/664 |
| 4,794,329 | 12/1988 | Schweitzer, Jr. | 324/127 |
| 4,794,331 | 12/1988 | Schweitzer, Jr. | 324/133 |
| 4,794,332 | 12/1988 | Schweitzer, Jr. | 324/133 |
| 4,795,982 | 1/1989 | Schweitzer, Jr. | 324/508 |
| 4,873,706 | 10/1989 | Schweitzer, Jr. | 377/85 |
| 4,904,932 | 2/1990 | Schweitzer, Jr. | 324/133 |
| 5,008,651 | 4/1991 | Schweitzer, Jr. | 340/664 |
| 5,070,301 | 12/1991 | Schweitzer, Jr. | 324/509 |
| 5,077,520 | 12/1991 | Schweitzer, Jr. | 324/133 |
| 5,095,265 | 3/1992 | Schweitzer, Jr. | 324/133 |
| 5,153,565 | 10/1992 | Schweitzer, Jr. | 340/650 |
| 5,180,972 | 1/1993 | Schweitzer, Jr. | 324/127 |
| 5,220,311 | 6/1993 | Schweitzer, Jr. | 340/650 |
| 5,274,324 | 12/1993 | Schweitzer, Jr. | 324/96 |
| 5,363,088 | 11/1994 | Schweitzer, Jr. | 340/660 |
| 5,406,195 | 4/1995 | Schweitzer, Jr. | 324/96 |
| 5,420,502 | 5/1995 | Schweitzer, Jr. | 324/96 |

Primary Examiner—Jeffery A. Hofsass
Assistant Examiner—Julie B. Lieu
Attorney, Agent, or Firm—Lockwood,Alex,Fitzgibbon & Cummings

[57] ABSTRACT

A fault indicator for use in conjunction with a load-break elbow connector includes a resilient mounting collar which wraps around the body of the fault indicator at a location overlying the arc-suppressing non-conductive margin between the electrically conductive sheath and the connecting end of the connector. An electrically conductive layer on the inside surface of the collar capacitively couples the circuitry of the fault indicator to the conductor within the connector to provide operating power to the fault indicator. A ground connection is provided by a second conductive layer on the collar which contacts the grounded connector sheath, or by a spring contact which extends from the fault indicator to the sheath. A voltage indicator is also disclosed using the same collar and capacitive coupling to the monitored conductor.

57 Claims, 6 Drawing Sheets

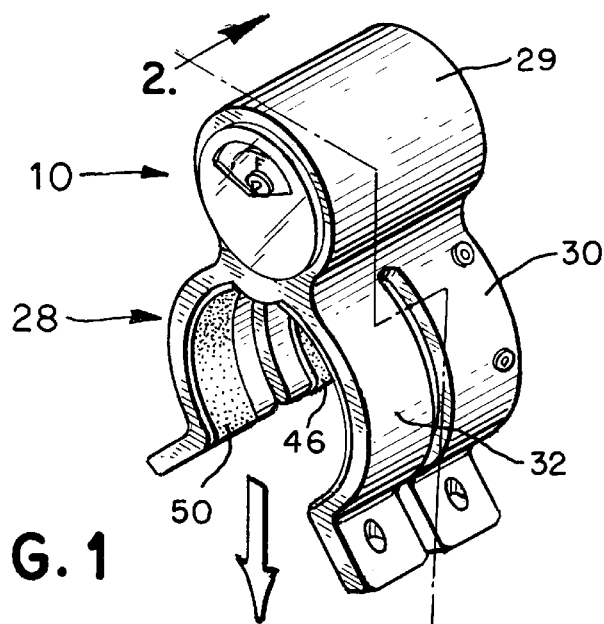
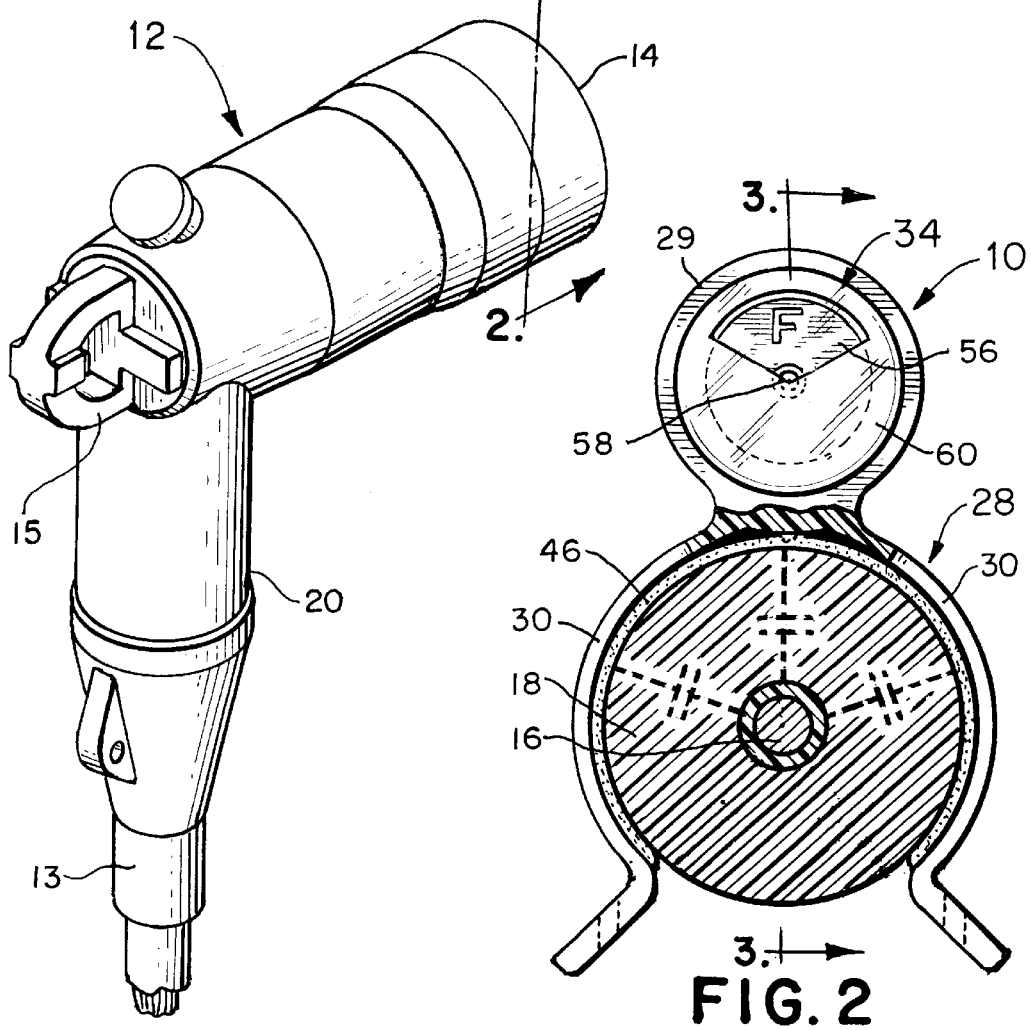
FIG. 1
FIG. 2

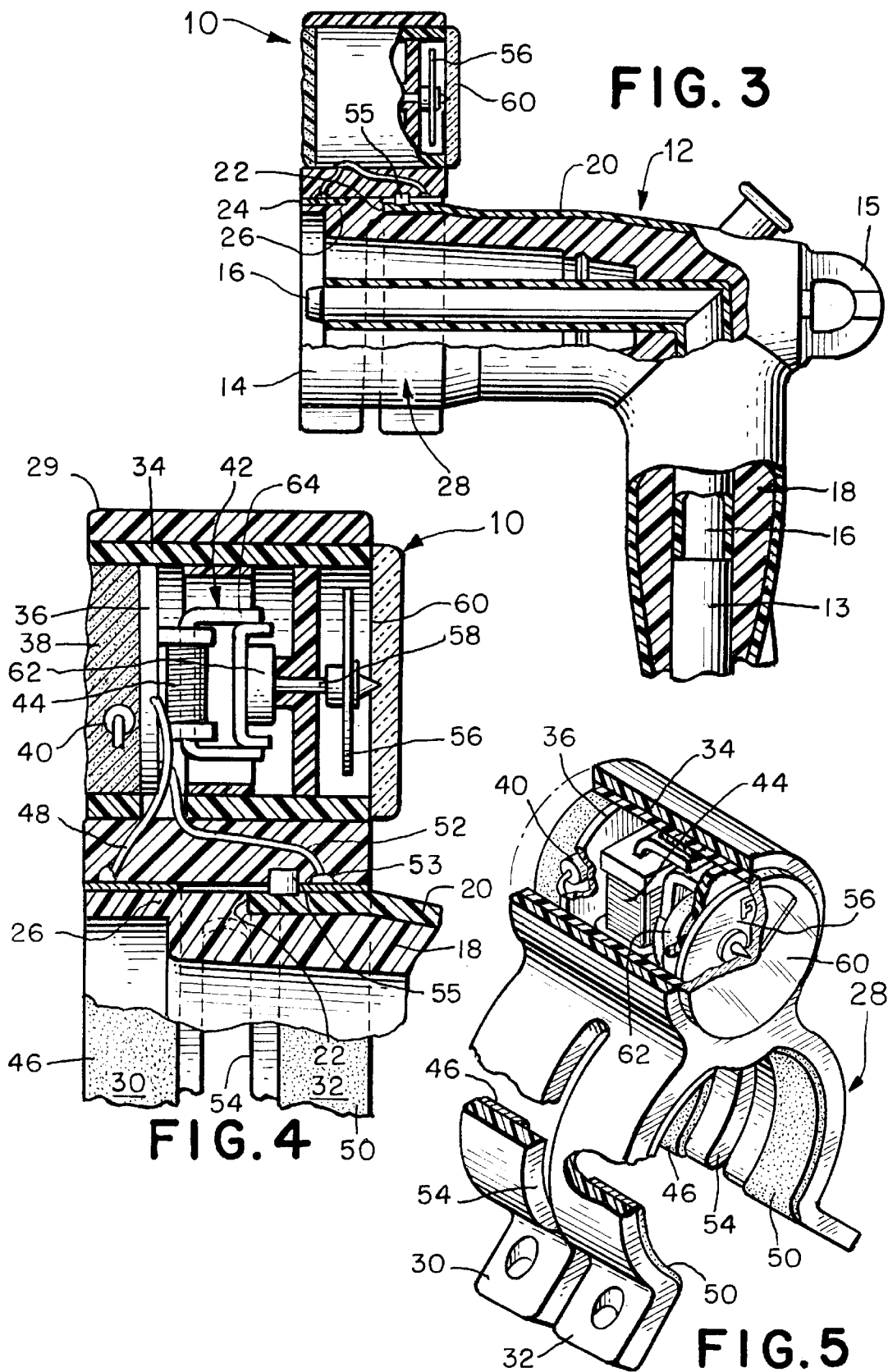

FAULT INDICATOR FOR USE WITH LOAD-BREAK CONNECTOR

BACKGROUND OF THE INVENTION

The present invention is generally directed to fault and voltage indicators, and more particularly, to circuit condition indicators having a resilient mounting collar adapted for installation on a load-break elbow connector of a power distribution system to provide operating power to the fault indicator.

Various types of fault indicators have been constructed for detecting electrical faults in high voltage attenuating current power distribution systems, including clamp-on type fault indicators, which mount on a cable within such systems, and test-point mounted fault indicators, which typically mount on a test point incorporated in a component of the systems. Various types of voltage indicators have been constructed for monitoring the voltage level of a monitored conductor, typically by providing a light which flashes at a rate which is indicative of the voltage level.

Typically, such circuit condition indicators are mounted on a test point socket provided on a plug-in connector of the type commonly used in either load-break or non load-break forms for establishing a plug-in connection to a transformer or other system component. Operating power is derived by a capacitive coupling through the test point to the conductor contained within the elbow connector.

One drawback of prior test-point mounted circuit condition indicators was that they could not be used on connectors which did not include a test point. Use of an indicator in such cases has required that the connector be replaced with one having a test point, which is a costly and time consuming procedure.

The present invention overcomes this drawback by providing a circuit condition indicator having a collar which clamps over the outside of the arc-suppressing end of a load-break connector.

Load-break connectors, like all connectors, have an electrically-conductive outer sheath layer which is conventionally grounded in accordance with electrical safety standards. To prevent the occurrence of an electrical arc between the grounded sheath and the terminal of the system component on which the connector is installed during removal of the connector, the sheath layer of a load-break connector terminates short of the connecting end of the connector, forming an unshielded electrically non-conductive margin at the connecting end. The circuit condition indicator of the present invention utilizes this sheath-free margin by providing a resilient collar having an electrically conductive layer on its inner surface which is designed to overlie the margin and capacitively couple the circuitry of the indicator to the electrical conductor within the connector. In this way, the collar derives operating power for the circuitry of the indicator.

Accordingly, it is a general object of the present invention to provide a new and improved circuit condition indicator powered by capacitive coupling to an electrical conductor of a high voltage alternating current power distribution system.

It is a more specific object of the present invention to provide a circuit condition indicator for use with an elbow connector of the load-break type which does not have an integral test point socket.

SUMMARY OF THE INVENTION

The invention is directed to a removable circuit condition indicator adapted to mount on an electrical connector and which includes circuitry operable by capacitive coupling to an electrical conductor within the connector, wherein the connector includes an electrically grounded outer sheath layer and a sheath-free arc-suppressing non-electrically conductive margin at its connecting end. The indicator comprises a housing and a collar which mounts the housing on the connector over the sheath-free margin, the collar including an electrically conductive inner surface providing a capacitive coupling to the conductor, and means for connecting the indicator circuitry to the conductive surface to receive operating power therefrom.

The invention is further directed to a removable fault indicator which is adapted to mount on an elbow connector and which includes circuitry operable by capacitive coupling to an electrical conductor within the connector, the connector including an electrically grounded outer sheath layer and a sheath-free arc-suppressing non-electrically conductive margin at its connecting end. The fault indicator comprises a housing, an indicator flag having a normal reset-indicating state and a fault-indicating state, actuator means for positioning the indicator flag to the fault-indicating state upon the occurrence of a fault current in the conductor, the actuator means being contained within the housing and being operable from an applied electrical current, a collar extending from the housing for mounting the housing over the sheath-free margin, and the collar including an electrically-conductive surface providing a capacitive coupling to the conductor, the fault indicator circuitry being electrically connected to the conductive surface to receive operating power therefrom.

The invention is further directed to a removable voltage indicator adapted to mount on an electrical connector and which includes circuitry operable by capacitive coupling to an electrical conductor within the connector, wherein the connector includes an electrically grounded outer sheath layer and a sheath-free arc-suppressing non-electrically conductive margin at its connecting end. The indicator comprises a housing and a collar which mounts the housing on the connector over the sheath-free margin, the collar including an electrically conductive inner surface providing a capacitive coupling to the conductor, means for connecting the indicator circuitry to the conductive surface to receive operating power therefrom, and an indicator powered by the indicator circuitry and viewable from the exterior of the housing for indicating the voltage level in the conductor.

BRIEF DESCRIPTION OF THE DRAWINGS

The features of the present invention which are believed to be novel are set forth with particularity in the appended claims. The invention, together with the further objects and advantages thereof, may best be understood by reference to the following description taken in conjunction with the accompanying drawings, in the several figures of which like reference numerals identify like elements, and in which:

FIG. 1 is an exploded perspective view of the fault indicator of the invention installed on a conventional load-break elbow connector.

FIG. 2 is a cross-sectional view of the fault indicator and elbow connector taken along line 2—2 of FIG. 1.

FIG. 3 is a side elevational view partially in section taken along line 2—2 of FIG. 2 showing the fault indicator installed on the elbow connector.

FIG. 4 is an enlarged cross-sectional view of the fault indicator and a portion of the elbow connector of FIG. 3.

FIG. 5 is a perspective view partially in section of the fault indicator of FIGS. 1–4.

DESCRIPTION OF THE PREFERRED EMBODIMENT

Figure 6A:
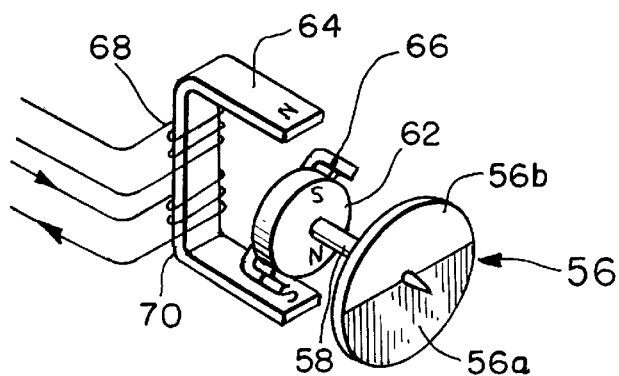
FIGS. 6a and 6b are diagrammatic view showing the principal components of the indicator flag assembly of the fault indicator in a reset-indicating position.

Referring to the drawings, and particularly to FIGS. 1–3, a fault indicator 10 constructed in accordance with the invention is shown installed on a conventional elbow connector 12 of the type used in high voltage alternating current power distribution systems for establishing a plug-in connection to a transformer or other system component (not shown). The elbow connector, in accordance with conventional practice, is generally L-shaped and includes a cable receiving end 13, a connecting or plug end 14 and a hook 15 for ease of installation and removal on a system component. The elbow connector 12 further includes an electrical conductor 16 (FIG. 3) which extends generally axially from one end to the other through an electrically non-conductive body portion 18 which is encased in an electrically-conductive sheath 20, the sheath being grounded in accordance with conventional practice. At the plug end 14 of the elbow connector sheath 20 has a circumferential end margin 22 that terminates short of the connector end face 24 and is spaced apart from end face 24, thereby forming a sheath-free margin portion generally designated as 26.

In accordance with the invention, fault indicator 10 is mounted on elbow connector 12 by a resilient generally C-shaped collar 28 which overlies the sheath-free margin 26. The collar, which is formed as a single piece of a non-metallic plastic polycarbonate such as Lexan (trademark), is formed at its top end 29 to receive the fault indicator housing, and at its bottom end to provide two axially-spaced collar portions 30 and 32 which individually encircle and engage the connector body for ease of installation and removal on the elbow connector.

Referring to FIGS. 4 and 5, fault indicator module 12 is seen to include an electrically non-conductive cylindrical plastic housing 34 within which the electrical components of the fault indicator are contained. In particular, within housing 34 the fault indicator includes a disc-shaped insulator board 36 positioned perpendicularly to the axis of the housing at a location intermediate the ends thereof, and a layer 38 of epoxy material at the inside end of the housing for securing the insulator board in place. Additional electrical components included in housing 34 include a reed switch 40 for sensing the occurrence of a fault current in conductor 16, an electro-mechanical indicator flag assembly 42 for visually indicating the occurrence of a fault current, and a magnetic winding assembly 44 included in flag assembly 42 for actuating the indicator flag.

In accordance with the invention operating power for the circuitry of fault indicator 10 is derived from conductor 16 by means of an electrically conductive coating 46 of long filament carbon in a lacquer solvent etched or deposited on the inside surface of section 30 of collar 28, which coating provides, as illustrated in FIG. 2, a capacitive coupling to the conductor as it overlies the sheath-free margin 26 of the connector. By reason of the close spacing between the coating and the conductor and the almost complete encirclement of the conductor by the coating, an adequate alternating current is derived from the conductor for operation of the circuitry of the fault indicator. The alternating current derived from conductor 16 is conveyed to the fault indicator circuitry by a conductor 48 connected to coating 46 by a metal rivet 49 or other appropriate connecting means.

A ground return for the fault indicator circuitry may be provided by a second coating 50 provided on the inside surface of section 32 of collar 28. This coating, which is spaced from and electrically isolated from coating 46, contacts the electrically grounded outer sheath 20 of the elbow connector 12. A conductor 52 connected to the coating by a metallic rivet 53 or other means connects this coating to the fault indicator circuitry.

The slot 54 formed on collar 28 between sections 30 and 32 provides increased flexibility to the collar. To further aid in installation or removal of the collar, the inside surfaces of sections 30 and 32 may be coated with an electrically non-conductive silicon grease. A raised ridge or boss 55 (FIG. 3) which abuts a ridge on the surface of the connector housing may be optionally provided to assist in properly positioning the collar on the connector.

Figure 7A:
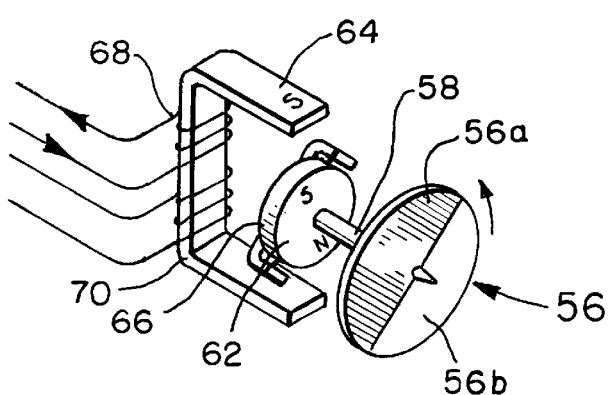
FIGS. 7a and 7b are diagrammatic views similar to FIGS. 6a and 6b, respectively, showing the principal components of the indicator flag assembly in transition between a reset-indicating position and a fault-indicating position.
Figure 7B:
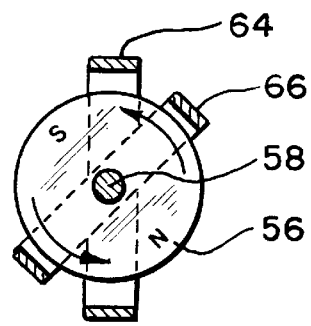
Figure 8A:
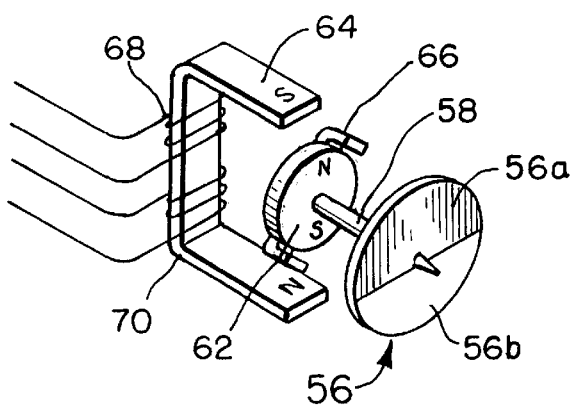
FIGS. 8a and 8b are diagrammatic views similar to FIGS. 6a and 6b, respectively, showing the principal components of the indicator flag assembly in a fault-indicating position.
Figure 8B:
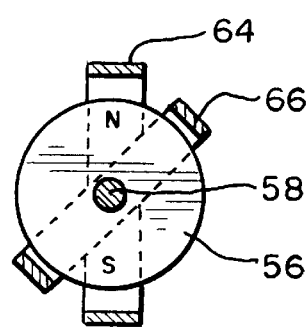

Except for the provision of collar 28 and its housing, fault indicator 10 may be conventional in construction and operation. Referring to FIGS. 6–8, to provide an indication of the occurrence of a fault current in conductor 16, the fault indicator includes as part of the previously identified indicator flag assembly 42, a disc-shaped target member 56 which is mounted for rotation on a pivot shaft. 58. The face of the target member has a red segment 56a and a white segment 56b only one of which is visible at a time through a window 60 (FIG. 3) at the transparent end of housing 34. In particular, red segment 56a is visible through window 60 when target member 56 is in a fault-indicating position. Conversely, white segment 56b is visible through window 60 when target member 56 is in a reset-indicating position.

Secured to and pivotal on shaft 58 with target member 56 is a disc-shaped target actuator magnet 62 which is formed of a magnetic material having a high coercive force, such as ceramic, and which is magnetically polarized to form two magnetic poles of opposite magnetic polarity, as indicated in FIGS. 6–8. Target actuator magnet 62, and hence target member 56, is rotated between reset-indicating and fault-indicating positions by rotational forces exerted on the magnet by means of a stationary generally U-shaped magnetic pole piece 64, which is located within the housing 34 of fault indicator 10 with projecting poles thereof diametrically opposed and adjacent the edge of the magnet.

Figure 6B:
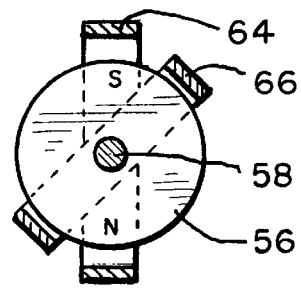

When the fault indicator is in a reset state, magnetic pole piece 64, which is preferably formed of a magnetic material having relatively low coercive force, such as a chrome steel, is magnetized at its projecting poles to the magnetic polarities indicated in FIGS. 6a and 6b. As a result, the opposite polarity magnetic poles of target actuator magnet 62 are attracted to position target member 56 in the reset indicating position as shown. In this position, the red segment 56a of the target member is not visible through window 60, and only white segment 56b is visible to indicate to an observer that the fault indicator is in a reset state.

Upon the occurrence of a fault current in monitored cable 16, which current may, for example, exceed 400 amperes or more, magnetic pole piece 64, and an adjacent auxiliary pole piece 66 of similar construction, are remagnetized to the magnetic polarities shown in FIGS. 7a–7b and FIGS. 8a–8b by momentary energization of a trip winding 68 on the center section of magnetic pole piece 64. As a result, the poles of target actuator magnet 62 are repelled by the adjacent like magnetic polarity poles of the pole piece and the target member is caused to rotate 180° counter-clockwise to the fault-indicating position shown in FIGS. 6a and 6b. In this position, the red segment 56a of the target member is visible through window 60 and a lineman viewing the fault indicator is informed that a fault current has occurred in monitored cable 16.

Target member 56 remains in the fault-indicating position until the poles of magnetic pole piece 64 and auxiliary pole piece 66 are subsequently remagnetized to the magnetic polarities shown in FIGS. 6a–6b by momentary energization of a reset winding 70 on the center section of the magnetic pole piece. As a result, target actuator magnet 62, and hence target member 56, are caused to rotate from the fault indicating position shown in FIGS. 8a–8b to the reset indicating position shown to FIGS. 6a–6b, and the fault indicator is conditioned to respond to a subsequent fault current in monitored cable 16.

Energization of trip winding 68 upon occurrence of a fault current in conductor 16, and energization of reset winding 70 upon restoration of current in conductor 16 following a fault, are accomplished by means of circuitry contained within the fault indicator housing 34.

Figure 9:
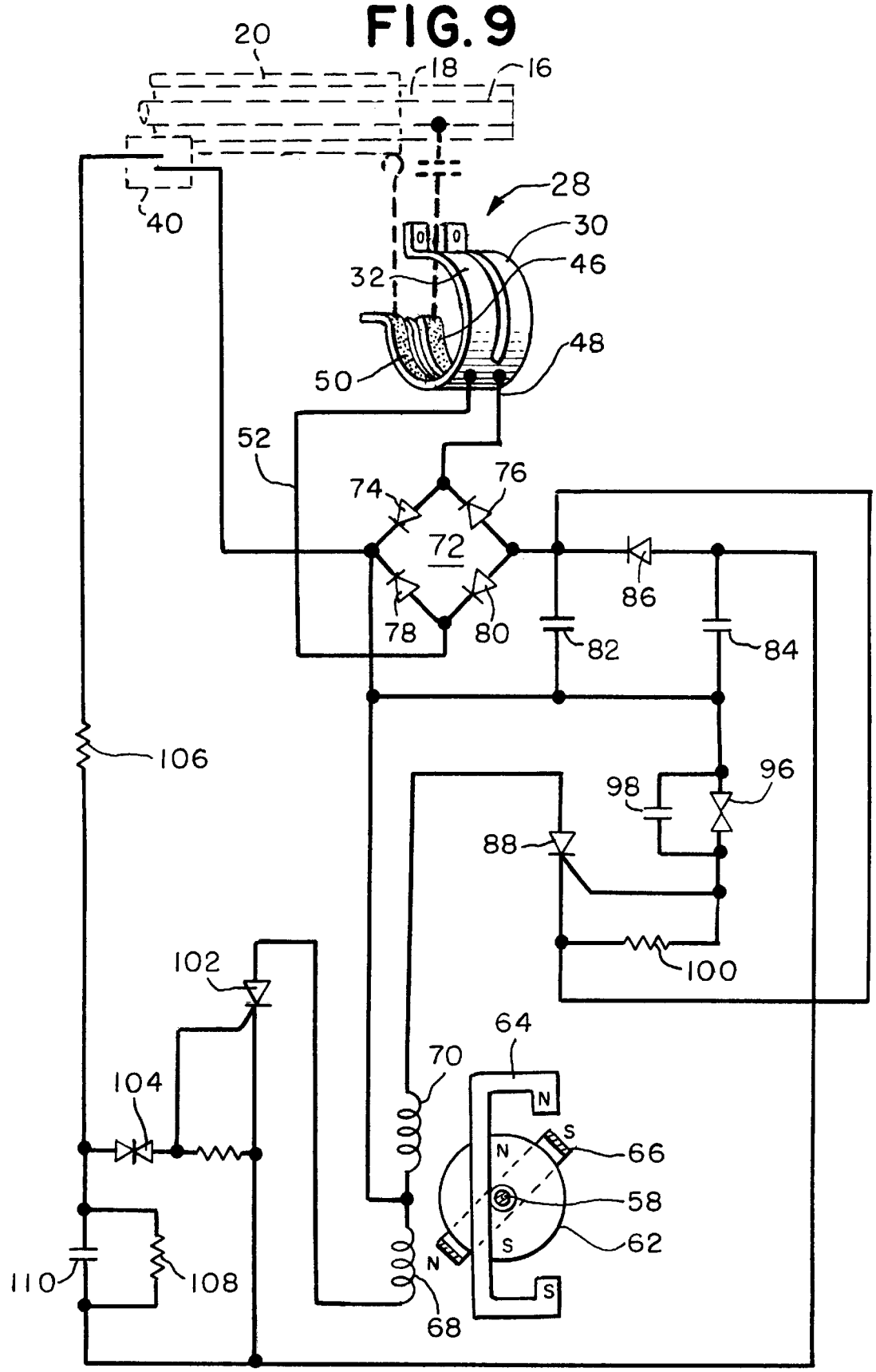
FIG. 9 is an electrical schematic diagram of the circuitry of the fault indicator.

Referring to the schematic diagram shown in FIG. 9, trip winding 68 and reset winding 70, which together comprise winding assembly 42, are connected end-to-end for independent energization upon occurrence of fault and reset conditions, respectively. Operating power for these windings is obtained by means of a bridge-rectifier network 72, consisting of diodes 74, 76, 78 and 80. One input terminal of this network, formed at the juncture of the anode of diode 74 and the cathode of diode 76, is connected by conductor 48 to the conductive coating 46 of collar 28, which is capacitively coupled to conductor 16. The other input terminal, formed at the juncture of the anode of diode 78 and the cathode of diode 80 is connected to the electrically conductive grounded sheath 20 of elbow connector 12 by conductor 52 and coating 50 on collar 28.

The positive polarity output terminal of the bridge rectifier network 72, formed at the juncture of the cathodes of diodes 74 and 78, is connected to one contact of reed switch 40, to the common terminals of windings 68 and 70, and to respective terminals of a pair of capacitors 82 and 84. The negative polarity output terminal of bridge rectifier network 72, formed at the juncture of the anodes of diodes 76 and 80, is connected directly to the remaining terminal of capacitor 82, and through a forward-biased diode 86 to the remaining terminal of capacitor 84. With this arrangement, capacitors 80 and 82 are charged by the pulsating unidirectional current developed by bridge rectifier network 72 in the presence of voltage on conductor 16. To provide for periodic energization of reset winding 70 during normal current flow in conductor 16, the remaining end terminal of winding 70 is connected through a silicon controlled rectifier (SCR) 88 to the negative polarity terminal of capacitor 82. Periodic conduction through SCR 88 is obtained by connecting the gate electrode of that device to the positive polarity output terminal of bridge rectifier network 72 through a bilateral diode 96 which is in parallel combination with a capacitor 98, and through a resistor 100 to the cathode of the SCR. With this arrangement, SCR 88 is periodically triggered into conduction when the voltage developed across bilateral diode 96 as a result of capacitor 82 being charged by bridge rectifier 72 reaches the threshold level of the bilateral diode.

In operation, under normal current flow conditions, the voltage developed across capacitor 82 as the capacitor is charged by bridge rectifier network 72 progressively increases with time, until the threshold breakdown voltage of bilateral diode 96 is reached, at which time SCR 88 is triggered and capacitor 82 discharges through winding 70. Diode 86 prevents capacitor 84 from being discharged through SCR 88 and winding 70, leaving that capacitor available for energizing winding 68 in response to a fault condition. In practice, the breakdown voltage of bilateral diode 96 may be in the order of 34 volts, and the time required for capacitor 82 to reach this threshold level with a voltage level of 4,400 volts on conductor 16 may be approximately two minutes. In any case, the voltage level within conductor 16 is not critical to the operation of the reset circuit, and has only the effect of changing the frequency of the reset cycle.

Trip winding 68 is energized upon occurrence of a fault current in conductor 16 by discharge of capacitor 84 through a second silicon controlled rectifier (SCR) 102. Conduction through SCR 102 is established by closure of the contacts of reed switch 40, which is positioned within housing 34 so as to be in magnetic communication with conductor 16 when the fault indicator is mounted over the sheath-free margin 26 of elbow connector 12. The gate electrode of SCR 102 is connected through a bilateral diode 104 and a resistor 106 to the contacts of reed switch 40, and by a resistor 108 and capacitor 110 to the SCR cathode. These components provide a slight time delay prior to SCR 102 becoming conductive in response to closure of switch 40.

Upon occurrence of a fault current in conductor 16, the positive polarity output terminal of bridge rectifier network 72 is connected through the then closed contacts of reed switch 40 and through the circuit comprising resistor 106, bilateral diode 104, resistor 108, capacitor 108, and resistor 110 to the gate electrode of SCR 102, causing that device to be rendered conductive following a predetermined time delay. At this time, capacitors 82 and 84 are caused to discharge through SCR 102 and energize winding 68. The resulting magnetic flux in the magnetic pole piece 64 reverses the magnetic pole polarities of the pole piece, thereby causing rotation of target magnet 62 and target member 56 to the fault-indicating state as previously described.

Figures 10, 11:
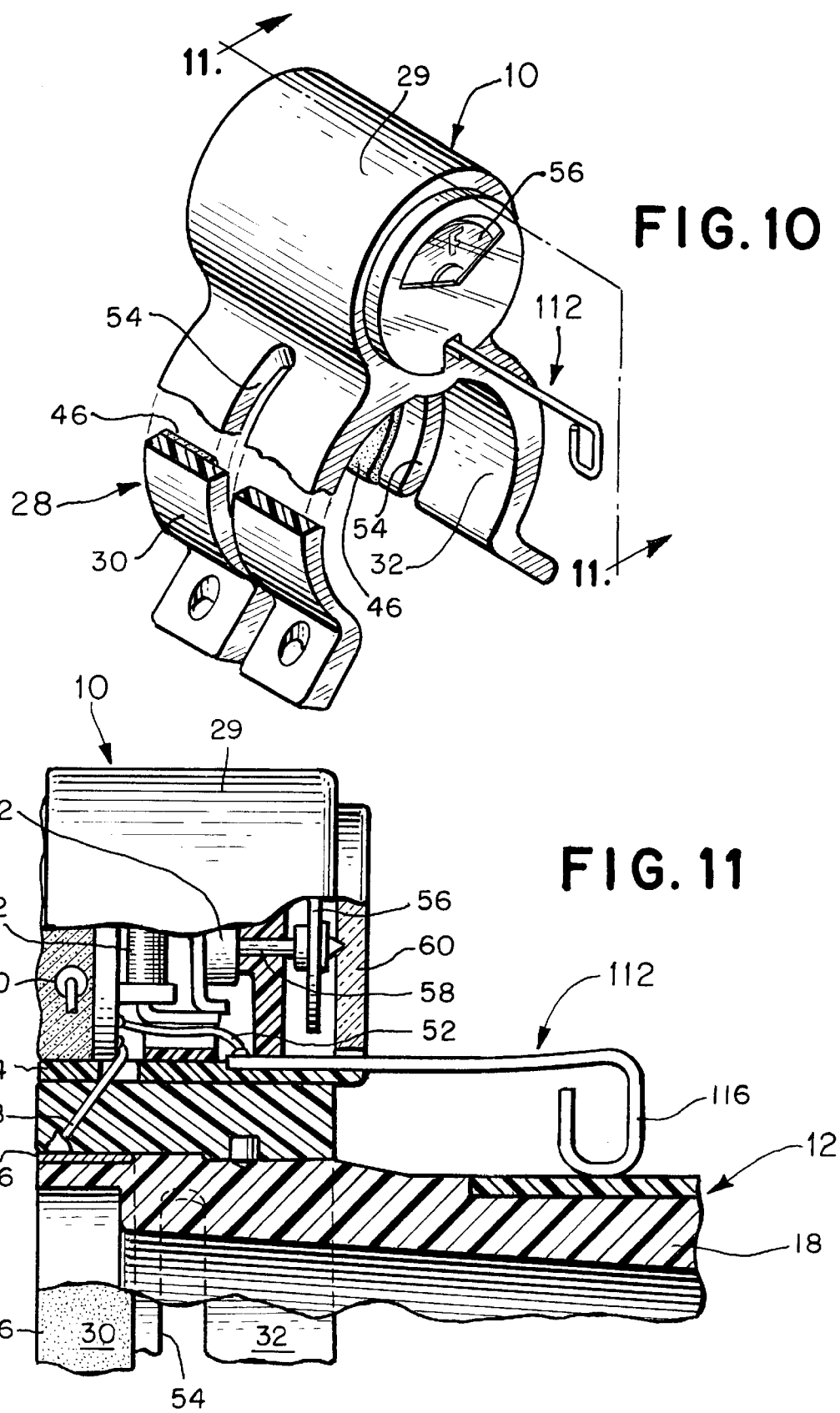
FIG. 10 is a perspective view of an alternative embodiment of the fault indicator which utilizes a spring contact for establishing a ground connector.
FIG. 11 is an enlarged side elevational view partially in section of the fault indicator and elbow connector of FIG. 10.

Referring to FIGS. 10 and 11, where the circuit condition indicator of the invention is used with a load-break connector wherein the electrically conductive grounded sheath layer is too far back from the connecting end of the connector to underlie the collar, or where an insulating cuff overlies the otherwise accessible surface of the sheath, a spring contact may be used to establish a ground connection.

More specifically, the electrically-conductive coating 50 provided on collar section 32 may be omitted, and conductor 52 is connected to a spring wire contact 112 which includes a straight portion 114 extending from housing 34 and a downwardly projecting end portion 116 which contacts sheath 20. In this way, the necessary ground connection is established through the spring contact and the indicator circuitry is powered.

Figure 12:
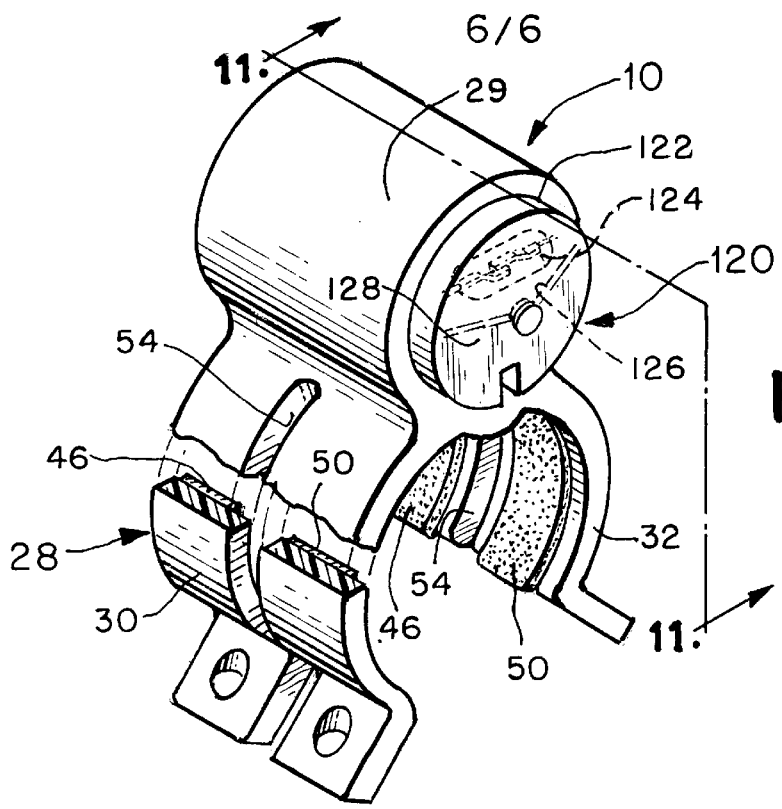
FIG. 12 is a perspective view of a voltage indicator constructed in accordance with the invention.
Figure 13:
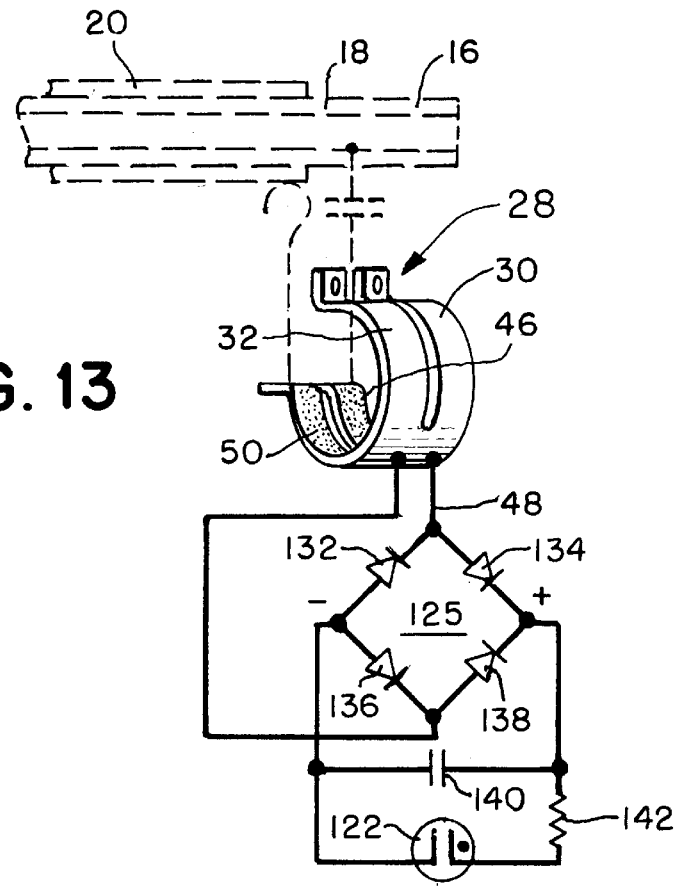
FIG. 13 is a schematic diagram of the voltage indicator of FIG. 12.

Referring to FIGS. 12 and 13, a voltage indicator 120 constructed in accordance with the invention utilizes the same collar 28 to derive operating power from the monitored conductor 16. In particular, the voltage indicator may include within the top end 29 of collar 28 a cylindrical housing 122 of identical dimensions to housing 34. The voltage indicator circuitry is contained within this housing and includes a neon lamp 124 which is visible through a window 126 on the front surface 128 of the housing. When conductor 16 is powered, the neon lamp flashes at a rate dependent on the voltage level in the conductor.

To provide operating power to the neon lamp 122 the circuitry of the voltage indicator includes a bridge rectifier network 125 comprising diodes 132, 134, 136 and 138 (FIG. 13). The positive polarity output of this rectifier network, available at the juncture of diodes 134 and 138, is connected directly to a capacitor 140 and through a resistor 142 to one terminal of lamp 122. When conductor 16 is powered, a pulsating direct current is developed at the output terminals of the bridge rectifier. This current charges capacitor 140. As the voltage across the capacitor increases, the ignition threshold of neon lamp 22 is reached, the lamp lights, and the capacitor is discharged through the lamp and resistor 142. As the capacitor discharges the voltage across the capacitor eventually reaches a level at which lamp 122 extinguishes and the capacitor again begins to charge.

Since the rate of charge of capacitor 140 is dependent on the voltage on conductor 16, lamp 122 flashes at a rate which is indicative of line voltage. In practice, line technicians may be provided with a chart from which they can connect the observed flashing rate to a line voltage.

It will be appreciated that the circuit condition indicator of the invention can be used with various types and constructions of connectors. For example, the connector can be a straight load-break connector, without the L-shape of an elbow connector. Furthermore, the indicator of the invention can be used in conjunction with connectors designed for various voltage ranges, including the 200 amp. 7.2 KV types without an insulating cuff, and the 200 amp. 15 KV type with an insulating cuff.

A circuit condition indicator has been shown which utilizes a removable collar to derive operating power from the conductor of a load break connector which does not have a test point, thereby enabling the conductor therein to be monitored without modification to or changing out of the installed connector.

While particular embodiments of the invention have been shown and described, it will be obvious to those skilled in the art that changes and modifications may be made therein without departing from the invention in its broader aspects, and, therefore, the aim in the appended claims is to cover all such changes and modifications as fall within the true spirit and scope of the invention.

I claim:

1. A removable circuit condition indicator adapted to mount on a connector and including circuitry operable by capacitive coupling to an electrical conductor within the connector, said connector including an electrically grounded outer sheath layer and a sheath-free arc-suppressing arcuate margin at its connecting end, said circuit condition indicator comprising:

a housing for said circuit condition indicator including a collar extending from said housing and having a pair of opposed arms extending around and engaging said elbow connector over said arcuate sheath free margin;

said collar including an electrically conductive inner surface providing a capacitive coupling to said conductor along said arcuate sheath-free margin; and the circuit condition indicator circuitry being electrically connected to said conductive surface to receive operating power therefrom.

2. A circuit condition indicator as defined in claim 1 wherein said collar is formed of a resilient non-electrically conductive plastic dimensioned for snap-mounting over said elbow connector.

3. A circuit condition indicator as defined in claim 2 wherein said electrically conductive surface of said collar comprises an electrically conductive layer on the inside surface of said collar.

4. A circuit condition indicator as defined in claim 3 wherein said electrically conductive layer comprises a layer of long-filament carbon in a lacquer solvent.

5. A circuit condition indicator as defined in claim 1 including means for connecting said circuit condition indicator circuitry to said sheath layer to provide a grounding means for a ground return for said circuitry.

6. A circuit condition indicator as defined in claim 5 wherein said grounding means comprise an additional conductive surface on said collar for engaging said electrically conductive sheath.

7. A circuit condition indicator as defined in claim 5 wherein said grounding means comprise a spring contact engaging said electrically conductive sheath.

8. A removable circuit condition indicator adapted to mount on a connector and including circuitry operable by capacitive coupling to an electrical conductor within the connector, said connector including an electrically grounded outer sheath layer and a sheath-free arc-suppressing arcuate margin at its connecting end, said circuit condition fault indicator comprising:

a housing for said circuit condition indicator including a collar extending from said housing and having a pair of opposed arms extending around and engaging said elbow connector over said arcuate sheath-free margin;

indicator means viewable from the exterior of the housing;

circuit means operable from an applied current for operating said indicator means in accordance with a sensed condition in the conductor;

said circuit means being contained within said housing and being operable from an applied electrical current;

said collar including an electrically conductive inner surface providing a capacitive coupling to said conductor along said arcuate sheath-free margin; and said circuit means being electrically connected to said conductive surface to receive operating power therefrom.

9. A circuit condition indicator as defined in claim 8 wherein said collar is formed of a resilient non-electrically conductive plastic dimensioned for snap-mounting over said elbow connector.

10. A circuit condition indicator as defined in claim 9 wherein said electrically conductive surface of said collar comprises an electrically conductive layer on the inside surface of said collar.

11. A circuit condition indicator as defined in claim 10 wherein said electrically conductive layer comprises a layer of long-filament carbon in a lacquer solvent.

12. A circuit condition indicator as defined in claim 11 including means for connecting said circuit condition indicator circuitry to said sheath layer to provide a grounding means for a ground return for said circuitry.

13. A circuit condition indicator as defined in claim 12 wherein said grounding means comprise an additional conductive surface on said collar for engaging said sheath layer.

14. A circuit condition indicator as defined in claim 13 wherein said grounding means comprise a spring contact engaging said sheath layer.

15. A removable circuit condition indicator adapted to mount on a connector and including circuitry operable by capacitive coupling to an electrical conductor within the connector, said connector including an electrically grounded outer sheath layer and a sheath-free arc-suppressing arcuate marginal portion at its connecting end, said indicator comprising:

a housing for said circuit condition indicator including a collar formed of resilient plastic material extending from said housing and dimensioned to engage said housing of said connector over said marginal portion;

indicator means viewable from the exterior to the housing;

circuit means for operating said indicator means in accordance with a sensed condition in the conductor;

said circuit means being contained within said housing and being operable from an applied electrical current;

said collar including an electrically conductive layer on the inside thereof providing a capacitive coupling to said electrical conductor within said connector; and said circuit means being electrically connected to said layer to receive operating power therefrom.

16. A circuit condition indicator as defined in claim 15 wherein said electrically conductive layer comprises a layer of long-filament carbon in a lacquer solvent.

17. A circuit condition indicator as defined in claim 15 including means for connecting said circuit condition indicator circuitry to said sheath layer to provide a grounding means for a ground return for said circuitry.

18. A circuit condition indicator as defined in claim 17 wherein said grounding means comprise an additional conductive surface on said collar for engaging said electrically conductive sheath.

19. A circuit condition indicator as defined in claim 17 wherein said grounding means comprise a spring contact engaging said electrically conductive sheath.

20. A removable fault indicator adapted to mount on an elbow connector and including circuitry operable by capacitive coupling to an electrical conductor within the connector, said connector including an electrically grounded outer sheath layer and a sheath-free arc-suppressing arcuate margin at its connecting end, said fault indicator comprising:

a housing for said fault indicator including a collar extending from said housing and having a pair of opposed arms extending around and engaging said elbow connector over said arcuate sheath free margin;

said collar including an electrically conductive inner surface providing a capacitive coupling to said conductor along said arcuate sheath-free margin; and the fault indicator circuitry being electrically connected to said conductive surface to receive operating power therefrom.

21. A fault indicator as defined in claim 20 wherein said collar is formed of a resilient non-electrically conductive plastic dimensioned for snap-mounting over said elbow connector.

22. A fault indicator as defined in claim 21 wherein said electrically conductive surface of said collar comprises an electrically conductive layer on the inside surface of said collar.

23. A fault indicator as defined in claim 22 wherein said electrically conductive layer comprises a layer of long-filament carbon in a lacquer solvent.

24. A fault indicator as defined in claim 20 including means for connecting said fault indicator circuitry to said sheath layer to provide a grounding means for a ground return for said circuitry.

25. A fault indicator as defined in claim 24 wherein said grounding means comprise an additional conductive surface on said collar for engaging said electrically conductive sheath.

26. A fault indicator as defined in claim 24 wherein said grounding means comprise a spring contact engaging said electrically conductive sheath.

27. A removable fault indicator adapted to mount on an elbow connector and including circuitry operable by capacitive coupling to an electrical conductor within the connector, said connector including an electrically grounded outer sheath layer and a sheath-free arc-suppressing arcuate margin at its connecting end, said fault indicator comprising:

a housing for said fault indicator including a collar extending from said housing and having a pair of opposed arms extending around and engaging said elbow connector over said arcuate sheath-free margin;

an indicator flag having a normal state and a fault-indicating state;

actuator means operable from an applied current for positioning said indicator flag to said fault-indicating state upon the occurrence of a fault current in said conductor;

said actuator means being contained within said housing and being operable from an applied electrical current;

said collar including an electrically conductive inner surface providing a capacitive coupling to said conductor along said arcuate sheath-free margin; and said actuator means being electrically connected to said conductive surface to receive operating power therefrom.

28. A fault indicator as defined in claim 27 wherein said collar is formed of a resilient non-electrically conductive plastic dimensioned for snap-mounting over said elbow connector.

29. A fault indicator as defined in claim 28 wherein said electrically conductive surface of said collar comprises an electrically conductive layer on the inside surface of said collar.

30. A fault indicator as defined in claim 29 wherein said electrically conductive layer comprises a layer of long-filament carbon in a lacquer solvent.

31. A fault indicator as defined in claim 30 including means for connecting said fault indicator circuitry to said sheath layer to provide a grounding means for a ground return for said circuitry.

32. A fault indicator as defined in claim 31 wherein said grounding means comprise an additional conductive surface on said collar for engaging said electrically conductive sheath.

33. A fault indicator as defined in claim 32 wherein said grounding means comprise a spring contact engaging said electrically conductive sheath.

34. A removable fault indicator adapted to mount on an elbow connector and including circuitry operable by capacitive coupling to an electrical conductor within the connector, said connector including an electrically grounded outer sheath layer and a sheath-free arc-suppressing arcuate margin at its connecting end, said fault indicator comprising:

a housing for said fault indicator including a collar formed of resilient plastic material extending from said housing and dimensioned to engage said elbow connector over said marginal portion;

an indicator flag having a normal state and a fault-indicating state;

actuator means for positioning said indicator flag to said fault-indicating state upon the occurrence of a fault current in said conductor;

said actuator means being contained within said housing and being operable from an applied electrical current;

said collar including an electrically conductive layer on the inside thereof providing a capacitive coupling to said electrical conductor within said elbow connector; and said actuator means being electrically connected to said layer to receive operating power therefrom.

35. A fault indicator as defined in claim 34 wherein said electrically conductive layer comprises a layer of long-filament carbon in a lacquer solvent.

36. A fault indicator as defined in claim 34 including means for connecting said fault indicator circuitry to said sheath layer to provide a grounding means for a ground return for said circuitry.

37. A fault indicator as defined in claim 36 wherein said grounding means comprise an additional conductive surface on said collar for engaging said electrically conductive sheath.

38. A fault indicator as defined in claim 36 wherein said grounding means comprise a spring contact engaging said electrically conductive sheath.

39. A removable voltage indicator adapted to mount on a connector and including circuitry operable by capacitive coupling to an electrical conductor within the connector, said connector including an electrically grounded outer sheath layer and a sheath-free arc-suppressing arcuate margin at its connecting end, said voltage indicator comprising:

a housing for said voltage indicator including a collar extending from said housing and having a pair of opposed arms extending around and engaging said elbow connector over said arcuate sheath free margin;

said collar including an electrically conductive inner surface providing a capacitive coupling to said conductor along said arcuate sheath-free margin; and the voltage indicator circuitry being electrically connected to said conductive surface to receive operating power therefrom.

40. A voltage indicator as defined in claim 39 wherein said collar is formed of a resilient non-electrically conductive plastic and dimensioned for snap-mounting over said elbow connector.

41. A voltage indicator as defined in claim 40 wherein said electrically conductive surface of said collar comprises an electrically conductive layer on the inside surface of said collar.

42. A voltage indicator as defined in claim 41 wherein said electrically conductive layer comprises a layer of long-filament carbon in a lacquer solvent.

43. A voltage indicator as defined in claim 39 including means for connecting said fault indicator circuitry to said sheath layer to provide a grounding means for a ground return for said circuitry.

44. A voltage indicator as defined in claim 43 wherein said grounding means comprise an additional conductive surface on said collar for engaging said electrically conductive sheath.

45. A voltage indicator as defined in claim 43 wherein said grounding means comprise a spring contact engaging said electrically conductive sheath.

46. A removable voltage indicator adapted to mount on a connector and including circuitry operable by capacitive coupling to an electrical conductor within the connector, said connector including an electrically grounded outer sheath layer and a sheath-free arc-suppressing arcuate margin at its connecting end, said voltage indicator comprising:

a housing for said voltage indicator including a collar extending from said housing and having a pair of opposed arms extending around and engaging said elbow connector over said sheath-free margin;

voltage indicator means viewable from the exterior of the housing;

circuit means operable from an applied current for operating said voltage indicator means in accordance with a sensed voltage on the conductor;

said circuit means being contained within said housing and being operable from an applied electrical current;

said collar including an electrically conductive inner surface providing a capacitive coupling to said conductor along said arcuate sheath-free margin; and said circuit means being electrically connected to said conductive surface to receive operating power therefrom.

47. A voltage indicator as defined in claim 46 wherein said collar is formed of a resilient non-electrically conductive plastic dimensioned for snap-mounting over said elbow connector.

48. A voltage indicator as defined in claim 47 wherein said electrically conductive surface of said collar comprises an electrically conductive layer on the inside surface of said collar.

49. A voltage indicator as defined in claim 48 wherein said electrically conductive layer comprises a layer of long-filament carbon in a lacquer solvent.

50. A voltage indicator as defined in claim 49 including means for connecting said voltage indicator circuit means to said sheath layer to provide a grounding means for a ground return for said circuitry.

51. A voltage indicator as defined in claim 50 wherein said grounding means comprise an additional conductive surface on said collar for engaging said electrically conductive sheath.

52. A voltage indicator as defined in claim 51 wherein said grounding means comprise a spring contact engaging said electrically conductive sheath.

53. A removable voltage indicator adapted to mount on a connector and including circuitry operable by capacitive coupling to an electrical conductor within the connector, said connector including an electrically grounded outer sheath layer and a sheath-free arc-suppressing arcuate margin at its connecting end, said voltage indicator comprising:

a housing for said voltage indicator including a collar formed of resilient plastic material extending from said housing and dimensioned to engage said housing of said connector over said marginal portion;

indicator means viewable from the exterior to the housing;

circuit means for operating said indicator means in accordance with a sensed voltage in the conductor;

said circuit means being contained within said housing and being operable from an applied electrical current;

said collar including an electrically conductive layer on the inside thereof providing a capacitive coupling to said electrical conductor within said connector; and said circuit means being electrically connected to said layer to receive operating power therefrom.

54. A voltage indicator as defined in claim 53 wherein said electrically conductive layer comprises a layer of long-filament carbon in a lacquer solvent.

55. A voltage indicator as defined in claim 53 including means for connecting said indicator circuitry to said sheath layer to provide a grounding means for a ground return for said circuitry.

56. A voltage indicator as defined in claim 55 wherein said grounding means comprise an additional conductive surface on said collar for engaging said electrically conductive sheath.

57. A voltage indicator as defined in claim 55 wherein said grounding means comprise a spring contact engaging said electrically conductive sheath.

\* \* \* \* \*